(12) United States Patent
Nakano et al.

(10) Patent No.: US 7,304,332 B2
(45) Date of Patent: Dec. 4, 2007

(54) COMPOUND SEMICONDUCTOR EPITAXIAL SUBSTRATE AND METHOD FOR MANUFACTURING SAME

(75) Inventors: Tsuyoshi Nakano, Ichihara (JP); Noboru Fukuhara, Tsukuba (JP)

(73) Assignees: Sumitomo Chemical Company Limited, Tokyo (JP); Sumika Epi Solution Company, Ltd., Tokyo (JP)

( * ) Notice: Subject to any disclaimer, the term of this patent is extended or adjusted under 35 U.S.C. 154(b) by 135 days.

(21) Appl. No.: 10/540,515

(22) PCT Filed: Dec. 19, 2003

(86) PCT No.: PCT/JP03/16394

§ 371 (c)(1),
(2), (4) Date: Jun. 23, 2005

(87) PCT Pub. No.: WO2004/059743

PCT Pub. Date: Jul. 15, 2004

(65) Prior Publication Data

US 2006/0054923 A1  Mar. 16, 2006

(30) Foreign Application Priority Data

Dec. 25, 2002  (JP) .............................. 2002-374548

(51) Int. Cl.
  *H01L 29/739*  (2006.01)
(52) U.S. Cl. .................................................. 257/194
(58) Field of Classification Search .............. 438/518; 257/190, 194; 117/105

See application file for complete search history.

(56) References Cited

U.S. PATENT DOCUMENTS

| 5,495,115 | A | * | 2/1996 | Kudo et al. ................. 257/190 |
| 5,762,706 | A | * | 6/1998 | Saito et al. ................. 117/105 |
| 6,429,103 | B1 | * | 8/2002 | Johnson et al. ............. 438/518 |

FOREIGN PATENT DOCUMENTS

| JP | 06-163599 | A | 6/1994 |
| JP | 6-163599 | A | 6/1994 |
| JP | 9-64062 | A | 3/1997 |
| JP | 09-64062 | A | 3/1997 |
| JP | 2994863 | B2 | 10/1999 |
| JP | 3224437 | B2 | 8/2001 |

OTHER PUBLICATIONS

J.W. Matthews et al., "Defects in Epitaxial Multilayers", *Journal of Crystal Growth*, vol. 27, 1974, pp. 118-125.
J.W. Matthews et al., "Defects in Epitaxial Multilayers", *Journal of Crystal Growth*, vol. 32, No. 2, 1976, pp. 265-273.

* cited by examiner

*Primary Examiner*—Michael Lebentritt
*Assistant Examiner*—Monica D. Harrison
(74) *Attorney, Agent, or Firm*—Sughrue Mion, PLLC

(57) ABSTRACT

A compound semiconductor epitaxial substrate having a pseudomorphic high electron mobility field effect transistor structure which comprises an InGaAs layer as a channel layer 9 and an InGaP layer containing n-type impurities as a front side electron supplying layer 12, wherein an electron mobility in the InGaAs layer at room temperature (300 K) has become 8000 $cm^2/V \cdot s$ or more by growing an epitaxial substrate having a pseudomorphic HEMT structure with an In composition of the channel layer 9 increased. Front side spacer layers 10 and 11 between the channel layer 9 and the front side electron supplying layer 12 may also be InGaP layers.

8 Claims, 6 Drawing Sheets

| | |
|---|---|
| i-Al$_{0.20}$Ga$_{0.80}$As    39.5nm | 13 |
| n-In$_{0.483}$Ga$_{0.517}$P    6nm    4E18/cm$^3$ | 12 |
| i-Al$_{0.20}$Ga$_{0.80}$As    3nm | 11 |
| i-GaAs    5.5nm | 10 |
| i-In$_{0.30}$Ga$_{0.70}$As    7.5nm | 9 |
| i-GaAs    5.5nm | 8 |
| i-Al$_{0.20}$Ga$_{0.80}$As    3nm | 7 |
| n-Al$_{0.20}$Ga$_{0.80}$As    4nm    3E18/cm$^3$ | 6 |
| i-Al$_{0.20}$Ga$_{0.80}$As    200nm | 5 |
| i-GaAs    250nm | 4 |
| i-Al$_{0.25}$Ga$_{0.75}$As    250nm | 3 |
| i-GaAs    200nm | 2 |
| GaAs    SUBSTRATE | 1 |

FIG.2

| | |
|---|---|
| i-Al$_{0.20}$Ga$_{0.80}$As 39.5nm | 33 |
| n-In$_{0.483}$Ga$_{0.517}$P 6nm 4E18/cm$^3$ | 32 |
| i-In$_{0.483}$Ga$_{0.517}$P 3nm | 31 |
| i-GaAs 5.5nm | 30 |
| i-In$_{0.30}$Ga$_{0.70}$As 7.5nm | 29 |
| i-GaAs 5.5nm | 28 |
| i-Al$_{0.20}$Ga$_{0.80}$As 3nm | 27 |
| n-Al$_{0.20}$Ga$_{0.80}$As 4nm 3E18/cm$^3$ | 26 |
| i-Al$_{0.20}$Ga$_{0.80}$As 200nm | 25 |
| i-GaAs 250nm | 24 |
| i-Al$_{0.25}$Ga$_{0.75}$As 250nm | 23 |
| i-GaAs 200nm | 22 |
| GaAs SUBSTRATE | 21 |

FIG.3

| | |
|---|---|
| i-Al$_{0.20}$Ga$_{0.80}$As    39.5nm | 53 |
| n-In$_{0.483}$Ga$_{0.517}$P    6nm    4E18/cm$^3$ | 52 |
| i-In$_{0.483}$Ga$_{0.517}$P    3nm | 51 |
| i-GaAs    5.5nm | 50 |
| i-In$_{0.30}$Ga$_{0.70}$As    7.5nm | 49 |
| i-GaAs    5.5nm | 48 |
| i-In$_{0.483}$Ga$_{0.517}$P    3nm | 47 |
| n-In$_{0.483}$Ga$_{0.517}$P    4nm    3E18/cm$^3$ | 46 |
| i-Al$_{0.20}$Ga$_{0.80}$As    200nm | 45 |
| i-GaAs    250nm | 44 |
| i-Al$_{0.25}$Ga$_{0.75}$As    250nm | 43 |
| i-GaAs    200nm | 42 |
| GaAs   SUBSTRATE | 41 |

FIG.4

| | |
|---|---|
| i-Al$_{0.20}$Ga$_{0.80}$As    39.5nm | 73 |
| n-In$_{0.483}$Ga$_{0.517}$P    6nm    4E18/cm$^3$ | 72 |
| i-Al$_{0.20}$Ga$_{0.80}$As    3nm | 71 |
| i-GaAs    2nm | 70 |
| i-In$_{0.19}$Ga$_{0.81}$As    14nm | 69 |
| i-GaAs    2nm | 68 |
| i-Al$_{0.20}$Ga$_{0.80}$As    3nm | 67 |
| n-Al$_{0.20}$Ga$_{0.80}$As    4nm    3E18/cm$^3$ | 66 |
| i-Al$_{0.20}$Ga$_{0.80}$As    200nm | 65 |
| i-GaAs    250nm | 64 |
| i-Al$_{0.25}$Ga$_{0.75}$As    250nm | 63 |
| i-GaAs    200nm | 62 |
| GaAs  SUBSTRATE | 61 |

FIG.5

| | |
|---|---|
| i-Al$_{0.20}$Ga$_{0.80}$As 39.5nm | 93 |
| n-In$_{0.483}$Ga$_{0.517}$P 6nm 4E18/cm$^3$ | 92 |
| i-In$_{0.483}$Ga$_{0.517}$P 3nm | 91 |
| i-GaAs 2nm | 90 |
| i-In$_{0.19}$Ga$_{0.81}$As 14nm | 89 |
| i-GaAs 2nm | 88 |
| i-Al$_{0.20}$Ga$_{0.80}$As 3nm | 87 |
| n-Al$_{0.20}$Ga$_{0.80}$As 4nm 3E18/cm$^3$ | 86 |
| i-Al$_{0.20}$Ga$_{0.80}$As 200nm | 85 |
| i-GaAs 250nm | 84 |
| i-Al$_{0.25}$Ga$_{0.75}$As 250nm | 83 |
| i-GaAs 200nm | 82 |
| GaAs SUBSTRATE | 81 |

| Layer | Description |
|---|---|
| 113 | i-Al$_{0.20}$Ga$_{0.80}$As 39.5nm |
| 112 | n-In$_{0.483}$Ga$_{0.517}$P 6nm 4E18/cm$^3$ |
| 111 | i-In$_{0.483}$Ga$_{0.517}$P 3nm |
| 110 | i-GaAs 2nm |
| 109 | i-In$_{0.19}$Ga$_{0.81}$As 14nm |
| 108 | i-GaAs 2nm |
| 107 | i-In$_{0.483}$Ga$_{0.517}$P 3nm |
| 106 | n-In$_{0.483}$Ga$_{0.517}$P 4nm 3E18/cm$^3$ |
| 105 | i-Al$_{0.20}$Ga$_{0.80}$As 200nm |
| 104 | i-GaAs 250nm |
| 103 | i-Al$_{0.25}$Ga$_{0.75}$As 250nm |
| 102 | i-GaAs 200nm |
| 101 | GaAs SUBSTRATE |

COMPOUND SEMICONDUCTOR EPITAXIAL SUBSTRATE AND METHOD FOR MANUFACTURING SAME

TECHNICAL FIELD

The present invention relates to a compound semiconductor epitaxial substrate used for a high electron mobility transistor using a III-V compound semiconductor, and a method for manufacturing the same.

BACKGROUND ART

Recently, there has dramatically been developed an electronic device which utilizes a III-V compound semiconductor mainly based on GaAs, taking advantage of features thereof such as abilities to operate at a ultra-high speed and at a higher frequency, and has still advanced steadily. When fabricating the electronic device which utilizes a compound semiconductor, a thin film crystalline layer with necessary properties has conventionally been fabricated on a single crystal substrate by means of various procedures such as an ion implantation method, a diffusion method, or an epitaxial growth method. The epitaxial growth method, among the above described various methods, has widely been used since it has become possible not only to control an impurity amount but also to control crystal composition or thickness in an extremely wide range and with precision.

Although procedures such as a liquid phase method, a vapor phase method, and a molecular beam epitaxy (referred to as a MBE method, herein after) which is one of the vacuum deposition methods have been known as the epitaxial growth method used for such purposes as described above, the vapor phase method has commercially and widely been used because of its ability to process a large amount of substrates with high controllability. Especially, an metalorganic pyrolysis method (referred to as a MOCVD method, hereinafter), in which an organometallic compound or a hydride of atomic species constituting an epitaxial layer is used as a source material and is pyrolyzed on the substrate to grow a crystal thereof, has recently been used widely since this method is applicable to a wide range of substances and is suitable for controlling the crystal composition and thickness with precision.

Based on the development of such manufacturing techniques as described above, there have recently been made various attempts to improve characteristics of a high electron mobility field effect transistor (referred to as a HEMT, hereinafter) which attracts attentions because of its usefulness as an important component of a high-frequency communication instrument. The HEMT is also referred to as a high electron mobility transistor, a modulation doped field effect transistor (MODFET), or a hetero-junction field effect transistor (HJFET), and an epitaxial structure used for the HEMT is characterized in that an electron supplying layer for supplying electrons and a channel layer through which electrons travel are separated from each other and play respective roles, and that a two-dimensional electron gas accumulated in the channel layer has a high electron mobility. An epitaxial substrate used for manufacturing the HEMT can be fabricated by employing a MOCVD method such that each of crystalline layers of GaAs and AlGaAs having necessary electron characteristics is laminated and grown on a GaAs substrate to obtain a required structure.

Although GaAs and AlGaAs materials have widely been used as materials for fabricating the above described devices since these materials with any compositions can match the lattice constants thereof with each other and allow for producing various hetero junctions while keeping good crystallinity thereof, it is also possible to grow a crystalline layer of InGaP by selecting an In composition such that the lattice constant thereof matches with that of GaAs. In this case, InGaP being lattice-matched with GaAs is known to have an In composition of 0.482 to 0.483 and a Ga composition of 0.518 to 0.517.

As for a III-V compound semiconductor material, $In_xGa_{(1-x)}As$ (wherein $0<x<1$) is extremely suitable as a hetero junction material for manufacturing the HEMT, because $In_xGa_{(1-x)}As$ is excellent in its electron transporting characteristic and is also capable of significantly changing its energy gap in accordance with the In composition. However, the $In_xGa_{(1-x)}As$ cannot be lattice-matched with GaAs, so that it has conventionally been impossible to obtain an epitaxial substrate for the HEMT with significant physical properties by using a $In_xGa_{(1-x)}As$ layer.

Based on the subsequent development of techniques, it has been found that a reliable hetero junction can be formed without unfavorably inducing a decrease in crystallinity such as producing a dislocation even when a material with lattice misfit is used provided that the misfit is within a limit of elastic deformation, so that there has been made an attempt to practically use an epitaxial substrate which utilizes $In_xGa_{(1-x)}As$ as a hetero junction material. Such limit values in the lattice misfit material are given as a function of composition and layer thickness, and in a material based on a InGaAs layer with respect to a GaAs layer for example, the limit value has theoretically been known to be represented by an equation as described in J. Crystal Growth, 27 (1974) p.118 and in J. Crystal Growth, 32 (1976) p.265, and this theoretical equation is known to be experimentally correct as a whole.

Thus, even in the case of an epitaxial substrate of a HEMT structure which utilizes a GaAs substrate, it has become possible to manufacture an epitaxial substrate having an InGaAs layer as a part thereof by using a strain layer within certain ranges of composition and layer thickness. For example, under the condition of usual crystal growth, it is possible to epitaxially grow an $In_xGa_{(1-x)}As$ layer in which $x=0.20$ and whose layer thickness is about 13 nm without inducing a decrease in its crystallinity, and consequently, an epitaxial substrate including such an $In_xGa_{(1-x)}As$ layer as a channel layer part of the conventional HEMT through which two-dimensional electrons flow is utilized for fabricating an electronic device which has a higher mobility and is excellent in a noise characteristic compared with the conventional device.

The HEMT, in which $In_xGa_{(1-x)}As$ as a strain layer is used for the channel layer part through which two-dimensional electrons flow, is referred to as a pseudomorphic high electron mobility field effect transistor (a pseudomorphic-HEMT) (hereinafter, referred to as a pseuodomorphic-HEMT).

In addition, as described above, InGaP can be lattice-matched with GaAs provided that an In composition is selected, and therefore, in the phseudomorphic-HEMT, an InGaP layer can be epitaxially grown as an electron supplying layer or spacer layer thereof instead of using an AlGaAs layer. InGaP provides a high-performance HEMT, because InGaP has advantages that impurities are hardly incorporated therein during the epitaxial growth and the crystal purity can be favorably maintained compared with AlGaAs, and that a deep level referred to as a DX center is never created when silicon is doped during the formation of an n-type layer as in the case of AlGaAs. In addition, there has been reported that InGaP is advantageously used for manufacturing an electron device because the InGaP has a larger energy gap and a lower surface level compared with AlGaAs.

When various epitaxial growths are performed in order to form a pseudomorphic-HEMT structure including an InGaP layer and an InGaAs strain layer on a GaAs substrate, the crystal growth has to be controlled so as to precisely control a thickness of a thin crystalline layer to be formed on the order of several nanometers, however, as a result of recent technical improvements, an MBE method being excellent in the layer thickness controllability as well as an MOCVD method being excellent in the mass productivity can control the layer thickness with high precision, and consequently, it is now possible to obtain an epitaxial substrate of the HEMT having substantially favorable characteristics.

As described above, when an InGaP layer is used for an electron supplying layer or an electron supplying layer and a spacer layer of the pseudomorphic HEMT structure, it has been found to be difficult to efficiently confine two-dimensional electrons generated from the electron supplying layer to the InGaAs channel layer, although it is possible to achieve improvements in characteristic of the electronic device such as a temperature characteristic. Thus, it has been difficult to improve a current value of the electronic device by increasing the two-dimensional electron gas concentration or to reduce a transient resistance of the electron device by increasing the electron mobility.

The reason thereof has been considered that an energy band profile of InGaP is different from that of AlGaAs, that is, there is no difference between a position of a conduction band of the energy band structure of GaAs and that of InGaP. If there is no difference between these positions of the conduction bands, electrons generated from the electron supplying layer can not be efficiently confined to the InGaAs channel layer, and consequently, reductions in the two-dimensional electron gas concentration and in the electron mobility would be induced. As the preventative measures against such problems, Japanese Patent No. 3224437 discloses a constitution which improves the two-dimensional electron gas concentration and the electron mobility by inserting a strain InGaP space layer between a channel layer and an InGaP electron supplying layer in order to make a difference between the positions of conduction bands. In addition, Japanese Patent No. 2994863 discloses a constitution which improves the two-dimensional electron gas concentration and the electron mobility by inserting an AlGaAs spacer layer between a channel layer and an InGaP electron supplying layer.

However, comparing with a result reported with respect to an epitaxial substrate used for the conventional AlGaAs pseudomorphic HEMT structure in which an InGaAs layer is used as a channel layer, an n-AlGaAs layer is used as an electron supplying layer, and an i-AlGaAs layer is used as a spacer layer between the channel layer and the electron supplying layer, both constitutions disclosed in the above described Japanese Patent No. 3224437 and Japanese Patent No. 2994863 have not yet achieved satisfactory electron mobilities, in view of the capability of the epitaxial substrate used for the pseudomorphic-HEMT structure which can make characteristics of the electronic device favorable by increasing each value of the two-dimensional electron gas concentration and the electron mobility.

For example, further improvements are desired when the pseudomorphic HEMT structure epitaxial substrate is used for various portable instruments such as cellphones, because an on-resistance can be decreased by further improving the electron mobility and thus it is possible to reduce power consumption. In addition, further improvements in the electron mobility are also desired in view of capabilities to reduce a calorific value by lowering the power consumption and to miniaturize of an apparatus by further increasing a degree of integration. Thus, in the epitaxial substrate for pseudomorphic-HEMT structure which uses InGaP as an electron supplying layer or as an electron supplying layer and a spacer layer, a further improved epitaxial substrate is strongly desired which has a higher two-dimensional electron gas concentration together with a higher electron mobility compared with the currently reported results.

DISCLOSURE OF THE INVENTION

An object of the present invention is to provide a compound semiconductor epitaxial substrate used for a pseudomorphic HEMT having a high electron mobility characteristic and a method for manufacturing the same, which can satisfy various requirements as described above.

The present inventors have devoted ourselves to solve the above described problems, and have consequently found that a difference can be made between a position of a conduction band of the energy band structure of an InGaAs layer and that of an InGaP layer by forming an epitaxial substrate of a pseudomorphic-HEMT structure with an In composition of the InGaAs channel layer being increased, and thus it is possible to form an epitaxial substrate having a higher electron mobility in combination with a higher two-dimensional gas concentration which have never been reported before, and have now achieved the present invention based on such findings.

According to a first aspect of the present invention, there is provided a compound semiconductor epitaxial substrate used for a pseudomorphic high electron mobility field effect transistor, comprising an InGaAs layer as a channel layer and an InGaP layer containing n-type impurities as a front side electron supplying layer, the InGaAs layer having an electron mobility at room temperature (300 K) of 8000 $cm^2/V \cdot s$ or more. A two-dimensional electron gas concentration in the above described channel layer at room temperature (300 K) may be $1.80 \times 10^{12}/cm^2$ or more.

According to a second aspect of the present invention, there is provided the compound semiconductor epitaxial substrate as described in the above first aspect, further comprising an InGaP layer as a front side spacer layer between the above described channel layer and the above described front side electron supplying layer. A two-dimensional electron gas concentration in the above-described channel layer at room temperature (300 K) may be $1.80 \times 10^{12}/cm^2$ or more.

According to a third aspect of the present invention, there is provided the compound semiconductor epitaxial substrate as described in the above second aspect, further comprising an InGaP layer containing n-type impurities as a back side electron supplying layer and comprising an InGaP layer as a back side spacer layer between the above described channel layer and the above described back side electron supplying layer. A two-dimensional electron gas concentration in the above described channel layer at room temperature (300 K) may be $1.80 \times 10^{12}/cm^2$ or more.

According to a fourth aspect of the present invention, there is provided the compound semiconductor epitaxial substrate as described in the above first, second, or third aspect, wherein an In composition of the InGaAs layer constituting of the above described channel layer is 0.25 or more.

According to a fifth aspect of the present invention, there is provided the compound semiconductor epitaxial substrate as described in the above first, second, or third aspect, wherein GaAs layers each of which has a thickness of 4 nm or more are laminated on the above described channel layer respectively in contact with a top surface and a bottom surface of the above described channel layer.

According to a sixth aspect of the present invention, there is provided a method for manufacturing the compound semiconductor epitaxial substrate as described in the above first, second, third, fourth, or fifth aspect, characterized in that an epitaxial layer of each compound semiconductor is formed by the use of an MOCVD method.

BRIEF DESCRIPTION OF THE DRAWINGS

FIG. 2 is a drawing showing a layer structure of an epitaxial substrate according to Example 2 of the present invention;

FIG. 3 is a drawing showing a layer structure of an epitaxial substrate according to Example 3 of the present invention;

FIG. 4 is a drawing showing a layer structure of an epitaxial substrate according to Comparative Example 1 of the present invention;

FIG. 5 is a drawing showing a layer structure of an epitaxial substrate according to Comparative Example 2 of the present invention.

BEST MODE FOR CARRYING OUT THE INVENTION

One example of the present invention will now be described in detail with reference to the drawings. Although a layer structure of an epitaxial substrate illustrated herein by way of example represents a structure for measuring characteristics of the epitaxial substrate, a layer structure of an epitaxial substrate used for an actual pseudomorphic-HEMT further comprises other layers such as an n-GaAs layer or an n-AlGaAs layer being laminated thereon. However, it is apparent that even such epitaxial substrate used for the actual pseudomorphic-HRMT will have the same characteristics as in the case of Examples described below.

EXAMPLE 1

Figure 1:
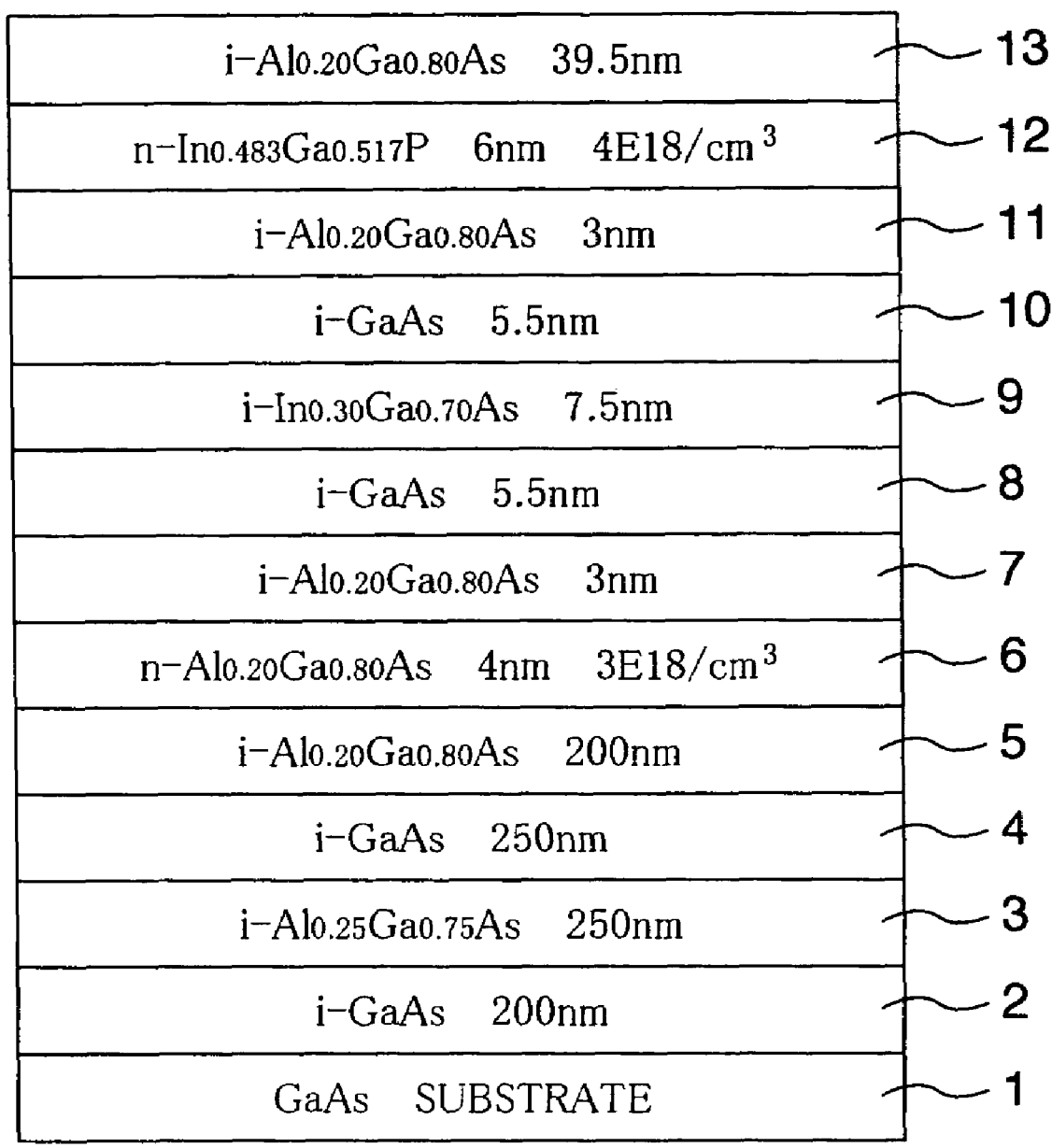
FIG. 1 is a drawing showing a layer structure of an epitaxial substrate according to Example 1 of the present invention.

FIG. 1 is a drawing for describing a cross-sectional structure of Example 1 of a HEMT structure epitaxial substrate according to the present invention. In FIG. 1, a reference numeral 1 denotes a GaAs layer which is a crystal substrate and each of reference numerals 2 to 5 denotes a buffer layer formed on the GaAs layer 1. The buffer layers 2 to 5 herein are formed as an i-GaAs layer having a thickness of 200 nm, an i-$Al_{0.25}Ga_{0.75}As$ layer having a thickness of 250 nm, an i-GaAs layer having a thickness of 250 nm, and an i-$Al_{0.20}Ga_{0.80}As$ layer having a thickness of 200 nm, respectively.

Reference numeral 6 denotes a back side electron supplying layer formed as an n-$Al_{0.20}Ga_{0.80}As$ layer having a thickness of 4 nm and doped with n-type impurities at a concentration of $3\times10^{18}/cm^3$. A back side spacer layers 7 and 8 are formed in this order on the back side electron supplying layer 6. The back side spacer layer 7 herein is an i-$Al_{0.20}Ga_{0.80}As$ layer having a thickness of 3 nm and the back side spacer 8 is an i-GaAs layer having a thickness of 5.5 nm. Reference numeral 9 denotes a channel layer in which two-dimensional electron gases are formed in order to flow two-dimensional electrons therethrough, and is an i-$In_{0.30}Ga_{0.70}As$ layer having a thickness of 7.5 nm.

Each of reference numerals 10 and 11 denotes a front side spacer layer. The front side spacer layer 10 is formed as an i-GaAs layer having a thickness of 5.5 nm, and the front side spacer layer 11 is formed as an i-$Al_{0.20}Ga_{0.80}As$ layer having a thickness of 3 nm.

Reference numeral 12 denotes a front side electron supplying layer formed as an n-$In_{0.483}Ga_{0.517}P$ layer having a thickness of 6 nm and doped with n-type impurities at a concentration of $4\times10^{18}/cm^3$. Reference numeral 13 denotes an undoped layer which is formed as an i-$Al_{0.20}Ga_{0.80}As$ layer having a thickness of 39.5 nm.

Then, a method for manufacturing the epitaxial substrate having such a layer structure as shown in FIG. 1 will be described. First, a surface of a highly resistive semi-insulating GaAs single crystal substrate is degreased and washed, etched, rinsed, and dried, and subsequently this single crystal substrate is placed on an heating table of a crystal growth reactor as a GaAs substrate 1.

An AlGaAs layer, an InGaAs layer, an InGaP layer and the like to be formed on the GaAs substrate 1 is vapor-phase grown by the use of an MOCVD method as described below. An inside of the reactor is substantially substituted with high purity hydrogen before starting a heating operation, and then once a moderate and stable temperature is reached within the reactor, arsenic source materials are introduced into the reactor and subsequently gallium source materials are introduced thereto for growing an GaAs layer. In addition, aluminum source materials are introduced thereto when an AlGaAs layer is grown, and indium source materials are also introduced thereto when an InGaP layer is grown. Also, phosphorous source materials are substituted for any of materials described above when an InGaP layer is grown. The desired laminated structure is being grown by controlling the predetermined time and the supply of respective source materials. Finally, the supply of respective source materials are terminated to stop the crystal growth, and after the cooling operation, the epitaxial substrate formed by laminating as described above is removed from the reactor to complete the crystal growth. A substrate temperature at a time of growing crystals is usually from about 500° C. to 800° C.

As a high resistive semi-insulating GaAs single crystal substrate in the present invention, it is possible to use a GaAs substrate manufactured by a LEC (Liquid Encapsulated Czochralski) method, a VB (Vertical Bridgeman) method, a VGF (Vertical Gradient Freezing) method and the like, the GaAs substrate having an angle of inclination from about 0.05° to 10° with respect to one crystallographic plane direction.

It is preferable that metalorganic compounds and/or hydrides are used as source materials during the epitaxial growth. Although arsenic trihydride (arsine) is generally used as an arsenic source material, it is also possible to use alkyl arsine which is obtained by substituting hydrogen of arsine with an alkyl group having 1 to 4 carbons. Although phosphorus trihydride (phosphine) is generally used as an phosphorus source material, it is also possible to use alkyl phosphine which is obtained by substituting hydrogen of pshosphine with an alkyl group having 1 to 4 carbons. As gallium, aluminum, and indium source materials, it is generally used a trialkylate or a trihydride which is obtained by bonding an alkyl group having 1 to 3 carbons or hydrogen to each metal atom.

As an n-type dopant, it is possible to use a hydride or an alkylate having an alkyl group with 1 to 3 carbon atoms of silicon, germanium, tin, sulfur, selenium or the like or an alkylate having an alkyl group whose carbon number is 1 to 3.

The epitaxial substrate shown in FIG. 1 was specifically manufactured as described below. However, the present invention is not intended to be limited to this one example.

A laminated structure shown in FIG. 1 was epitaxially grown on a semi-insulating GaAs substrate in accordance with a VGF method by the use of a low pressure barrel-typed MOCVD reactor. Trimethyl gallium (TMG), trimethyl aluminum (TMA), and trimethyl indium (TMI) were used as the third-group elements, while arsine ($AsH_3$) and phosphine ($PH_3$) were used as the fifth-group elements. Disilane ($Si_2H_6$) was used as n-type dopants. High purity hydrogen was used as a carrier gas for the source materials, and the epitaxial growth was performed under the conditions that a pressure within the reactor was 0.1 atm, a growth temperature was 650° C., and a growth rate was 3 to 1 μm/hr.

The InGaP layer in the laminated structure was epitaxially grown by adjusting an In composition so as to realize the lattice matching between the GaAs layer and the AlGaAs layer. In Example 1, the In composition of the InGaP layer was 0.483. Also in the structure of Example 1, the InGaP layer was epitaxially grown to obtain only a front side electron supplying layer.

The channel layer 9 through which electrons run was epitaxially grown using a strain InGaAs layer having an In composition of 0.30 and a thickness of 7.5 nm.

Each of i-GaAs layers acting as the front side spacer layer 10 and the back side spacer layer 8 respectively were epitaxially grown to a thickness of 5.5 nm so as to contact with a top surface and a bottom surface of the InGaAs layer grown as the channel layer 9 respectively.

According to the laminated structure of Example 1 shown in FIG. 1 which was fabricated by the epitaxial growth as described above, the result of performing the hall measurement in accordance with a Van der Pauw method showed better measurement values which had never been obtained before, that is, the channel layer 9 had a two-dimensional electron gas concentration of $1.81 \times 10^{12}/cm^2$ at room temperature (300 K), an electron mobility of 8360 $cm^2/V \cdot s$ at room temperature (300 K), a two-dimensional electron gas concentration of $2.13 \times 10^{12}/cm^2$ at 77 K, and an electron mobility of 33900 $cm^2/V \cdot s$ at 77 K. In addition, as a result of performing a CV measurement by using an Al schottky electrode with respect to this structure, a pinch-off voltage at a residual carrier concentration of $1 \times 10^{15}/cm^3$ was −1.74 V.

Since the epitaxial substrate shown in FIG. 1 is formed as described above, electrons are supplied from the back side electron supplying layer 6 to the channel layer 9 via the back side spacer layers 7 and 8, as well as supplying electrons from the front side electron supplying layer 12 to the channel layer 9 via the front side spacer layers 11 and 10. Consequently, two-dimensional electron gases having high mobilities are formed on a front side and a back side of the channel layer 9. Since the channel layer 9 herein was grown so as to have an In composition of 0.3 which is higher than 0.25, a difference can be made between a position of a conduction band of the energy band of the channel layer 9 and that of the front side electron supplying layer 12, the two-dimensional electron gas concentration in the channel layer 9 can be increased, and, a two-dimensional mobility of electrons of the two-dimensional electron gas can be markedly improved than ever before. As a result of reviewing the above described experiments, it has been found that a higher two-dimensional electron mobility can be obtained which exceeds a value obtained in an n-InGaP electron supplying layer HEMT structure reported heretofore, by adjusting the In composition to 0.25 or more.

Indeed, as for the epiaxial substrate shown in FIG. 1, a concentration of the two-dimensional electron gas could be increased as well as an electron mobility within the channel layer 9 could be improved to 8000 $cm^2/V \cdot s$ or more by adjusting the In composition in the channel layer 9 to 0.25 or more.

In addition, as a result of various experiments, it was confirmed that an electron mobility in the channel layer 9 of a structure shown in FIG. 1 at room temperature (300 K) could be at 8000 $cm^2/V \cdot s$, provided that a GaAs layer thickness of each of the back side spacer layer 8 and the front side spacer layer 10 which are respectively in contact with a bottom surface and a top surface of the channel layer 9 is 4 nm or more.

Thus, it can be considered that principal factors for improving an electron mobility in the channel layer 9 are an In composition of the channel layer 9 and a thickness of this layer, and further it has been found that the electron mobility can also be improved by using a VGF substrate or a VB substrate as a substrate.

EXAMPLE 2

An epitaxial substrate having a layer structure shown in FIG. 2 was fabricated in accordance with a MOCVD method as in the case of Example 1. In the epitaxial substrate shown in FIG. 2, a reference numeral 21 denotes a semi-insulating GaAs substrate, reference numerals 22 to 25 denote buffer layers, a reference numeral 26 denotes a back side electron supplying layer, reference numerals 27 and 28 denote back side spacer layers, a reference numeral 29 denotes a channel layer, reference numerals 30 and 31 denote front side spacer layers, a reference numeral 32 denotes a front side electron supplying layer, and a reference numeral 33 denotes an undoped AlGaAs layer. Composition and thickness of respective layers are as shown in FIG. 2.

As is evident from comparing FIG. 1 with FIG. 2, Example 2 is different from Example 1 because a front side spacer layer 31 is formed by obtaining an i-InGaP layer having an In composition of 0.483 and a thickness of 3 nm. Formation of other layers are the same as in the case of Example 1, respectively.

As for the epitaxial substrate obtained as described above, the result of performing the hall measurement in accordance with a Van der Pauw method showed better measurement values which had never been obtained before, that is, the channel layer 29 had a two-dimensional electron gas concentration of $1.89 \times 10^{12}/cm^2$ at room temperature (300 K), an electron mobility of 8630 $cm^2/V \cdot s$ at room temperature (300 K), a two-dimensional electron gas concentration of $2.16 \times 10^{12}/cm^2$ at 77 K, and an electron mobility of 32000 $cm^2/V \cdot s$ at 77 K. In addition, as a result of performing a CV measurement by using an Al schottky electrode with respect to this structure, a pinch-off voltage at a residual carrier concentration of $1 \times 10^{15}/cm^3$ was −1.80 V.

EXAMPLE 3

An epitaxial substrate having a layer structure shown in FIG. 3 was fabricated in accordance with a MOCVD method as in the case of Example 1. In the epitaxial substrate shown in FIG. 3, a reference numeral 41 denotes a semi-insulating GaAs substrate, reference numerals 42 to 45 denote buffer layers, a reference numeral 46 denotes a back side electron supplying layer, reference numerals 47 and 48 denote back side spacer layers, a reference numeral 49 denotes a channel layer, reference numerals 50 and 51 denote front side spacer layers, a reference numeral 52 denotes a front side electron supplying layer, and a reference numeral 53 denotes an undoped AlGaAs layer. Composition and thickness of respective layers are as shown in FIG. 2.

As is evident from comparing FIG. 1 with FIG. 3, Example 3 is different from Example 1 because each of a front side spacer layer 51 and a back side spacer layer 47 and a back side electron supplying layer 46 is formed by obtaining an i-InGaP layer having an In composition of 0.483 and a thickness of 3 nm. Formation of other layers are the same as in the case of Example 1, respectively.

As for the epitaxial substrate obtained as described above, the result of performing the hall measurement in accordance with a Van der Pauw method showed better measurement values which had never been obtained before, that is, the channel layer 49 had a two-dimensional electron gas concentration of $1.89 \times 10^{12}/cm^2$ at room temperature (300 K), an electron mobility of 8010 $cm^2/V \cdot s$ at room temperature (300 K), a two-dimensional electron gas concentration of $2.12 \times 10^{12}/cm^2$ at 77 K, and an electron mobility of 34200 $cm^2/V \cdot s$ at 77 K. In addition, as a result of performing a CV measurement by using an Al schottky electrode with respect to this structure, a pinch-off voltage at a residual carrier concentration of $1 \times 10^{15}/cm^3$ was −2.20 V.

COMPARATIVE EXAMPLE 1

An epitaxial substrate having a structure shown in FIG. 4 was fabricated as Comparative Example 1 in accordance with a MOCVD method as is the case of Example 1, except only for making modifications to the In composition and the thickness of the InGaAs layer used for the channel layer 9 and to the thickness of the i-GaAs layers 10 and 8 laminated on the top and bottom surfaces of the channel layer 9 of the pseudomorphic HEMT structure epitaxial substrate of Example 1 as shown in FIG. 1. In the epitaxial substrate shown in FIG. 4, a reference numeral 61 denotes a semi-insulating GaAs substrate, reference numerals 62 to 65 denote buffer layers, a reference numeral 66 denotes a back side electron supplying layer, reference numerals 67 and 68 denote back side spacer layers, a reference numeral 69 denotes a channel layer, reference numerals 70 and 71 denote front side spacer layers, a reference numeral 72 denotes a front side electron supplying layer, and a reference numeral 73 denotes an undoped AlGaAs layer. Composition and thickness of respective layers are as shown in FIG. 4.

In Comparative Example 1 as shown in FIG. 4, an InGaAs layer used as the channel layer 69 was prepared so as to have an In composition of 0.19 and a thickness of 14.0 nm, and then i-GaAs layers to be used as the back side spacer layer 68 and the front side spacer layer 70 respectively were epitaxially grown to a thickness of 2.0 nm on the top and bottom surfaces of the channel layer 69. A structure of this Comparative Example 1 is a pseudomorphic HEMT structure which has conventionally been well known. The structure of this Comparative Example 1 was fabricated by epitaxially growing respective layers under the same growth condition as in the case of Example 1.

As for the epitaxial substrate of Comparative Example 1, the result of performing the hall measurement in accordance with a Van der Pauw method showed that the measurement values were almost the same as values which had been reported before, that is, the channel layer 69 had a two-dimensional electron gas concentration of $1.77E12/cm^2$ at room temperature (300 K), an electron mobility of 7100 $cm^2/V \cdot s$ at room temperature (300 K), a two-dimensional electron gas concentration of $2.06E12/cm^2$ at 77 K, and an electron mobility of 22500 $cm^2/V \cdot s$ at 77 K. In addition, as a result of performing a CV measurement by using an Al schottky electrode with respect to this structure, a pinch-off voltage at a residual carrier concentration of $1E15\ cm^3$ was −1.72 V.

COMPARATIVE EXAMPLE 2

An epitaxial substrate having a structure shown in FIG. 5 was fabricated as Comparative Example 2 in accordance with a MOCVD method as is the case of Example 2, except only for making modifications to the In composition and the thickness of the InGaAs layer used for the channel layer 29 and to the thickness of the i-GaAs layers 28 and 30 laminated on the top and bottom surfaces of the channel layer 29 of the pseudomorphic HEMT structure epitaxial substrate of Example 2 as shown in FIG. 2. In the epitaxial substrate shown in FIG. 5, a reference numeral 81 denotes a semi-insulating GaAs substrate, reference numerals 82 to 85 denote buffer layers, a reference numeral 86 denotes a back side electron supplying layer, reference numerals 87 and 88 denote back side spacer layers, a reference numeral 89 denotes a channel layer, reference numerals 90 and 91 denote front side spacer layers, a reference numeral 92 denotes a front side electron supplying layer, and a reference numeral 93 denotes an undoped AlGaAs layer. Composition and thickness of respective layers are as shown in FIG. 5.

In Comparative Example 2 as shown in FIG. 5, an InGaAs layer used as the channel layer 89 was prepared so as to have an In composition of 0.19 and a thickness of 14.0 nm, and then i-GaAs layers to be used as the back side spacer layer 88 and the front side spacer layer 90 respectively were epitaxially grown to a thickness of 2.0 nm on the top and bottom surfaces of the channel layer 69. The structure of this Comparative Example 2 was fabricated by epitaxially growing respective layers under the same growth condition as in the case of Example 2.

As for the epitaxial substrate of Comparative Example 1, the result of performing the hall measurement in accordance with a Van der Pauw method showed that the measurement values were almost the same as values which had been reported before, that is, a two-dimensional electron gas concentration at room temperature (300 K) was $1.85E12/cm^2$, an electron mobility at room temperature (300 K) was 7030 $cm^2/V \cdot s$, a two-dimensional electron gas concentration at 77 K was $2.19E12/cm^2$, and an electron mobility at 77 K was 20800 $cm^2/V \cdot s$. In addition, as a result of performing a CV measurement by using an Al schottky electrode with respect to this structure, a pinch-off voltage at a residual carrier concentration of $1E15\ cm^3$ was −1.80 V.

COMPARATIVE EXAMPLE 3

Figure 6:
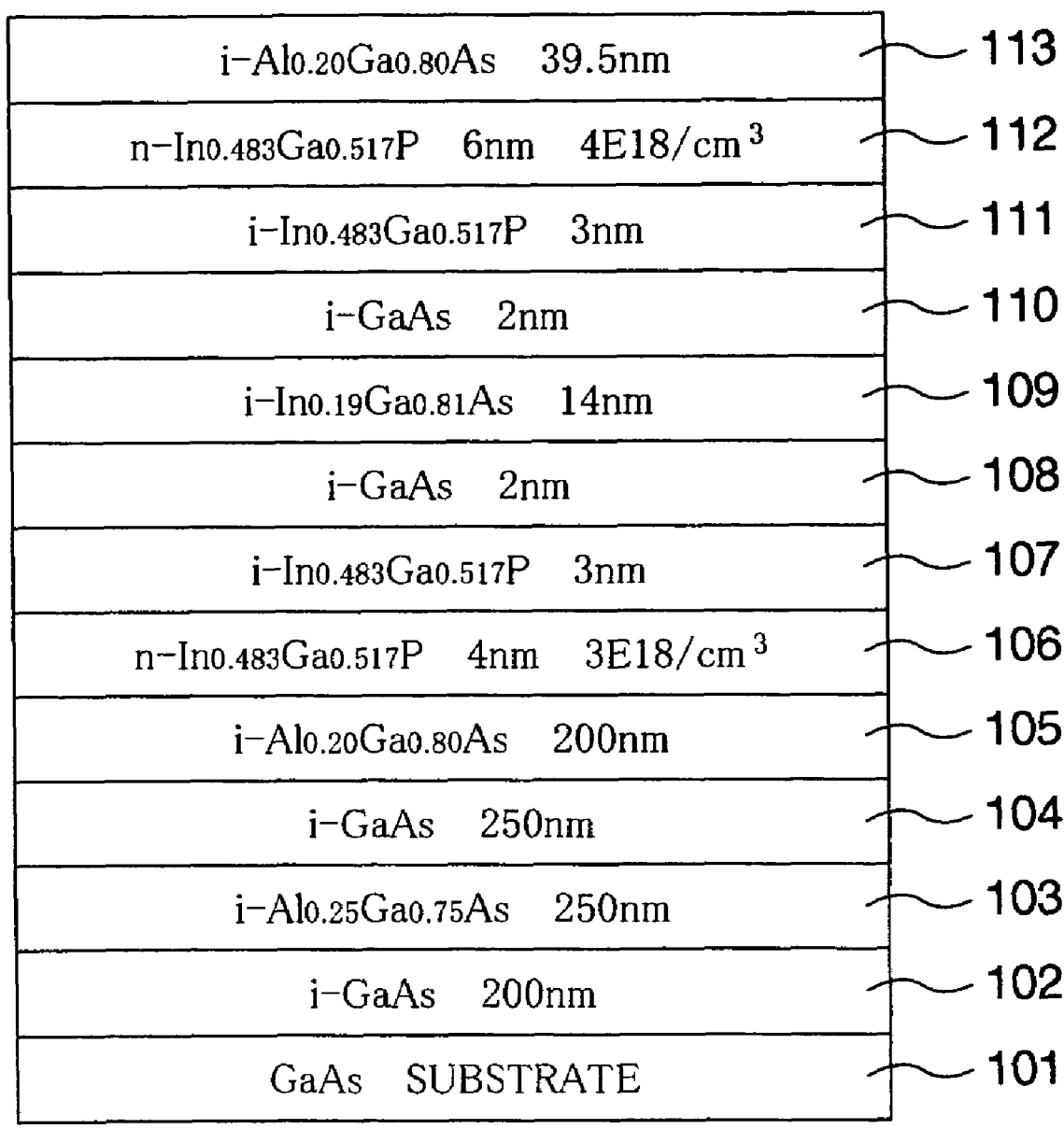
FIG. 6 is a drawing showing a layer structure of an epitaxial substrate according to Comparative Example 3 of the present invention.

An epitaxial substrate having a structure shown in FIG. 6 was fabricated as Comparative Example 3 in accordance with a MOCVD method as is the case of Example 3, except only for making modifications to the In composition and the thickness of the InGaAs layer used for the channel layer 49 and to the thickness of the i-GaAs layers 48 and 50 laminated on the top and bottom surfaces of the channel layer 49 of the pseudomorphic HEMT structure epitaxial substrate of Example 3 as shown in FIG. 3. In the epitaxial substrate shown in FIG. 6, a reference numeral 101 denotes a semi-insulating GaAs substrate, reference numerals 102 to 105 denote buffer layers, a reference numeral 106 denotes a back side electron supplying layer, reference numerals 107 and 108 denote back side spacer layers, a reference numeral 109 denotes a channel layer, reference numerals 110 and 111 denote front side spacer layers, a reference numeral 112 denotes a front side electron supplying layer, and a reference numeral 113 denotes an undoped AlGaAs layer. Composition and thickness of respective layers are as shown in FIG. 6.

In Comparative Example 3 as shown in FIG. 6, an InGaAs layer used as the channel layer 109 was prepared so as to have an In composition of 0.19 and a thickness of 14.0 nm, and then i-GaAs layers to be used as the back side spacer layer 108 and the front side spacer layer 110 respectively were epitaxially grown to a thickness of 2.0 nm on the top and bottom surfaces of the channel layer 109. The structure of this Comparative Example 3 was fabricated by epitaxially growing respective layers under the same growth condition as in the case of Example 3.

As for the epitaxial substrate of Comparative Example 3, the result of performing the hall measurement in accordance with a Van der Pauw method showed that the lower measurement values could only be obtained, that is, the channel layer 109 had a two-dimensional electron gas concentration of $1.99E12/cm^2$ at room temperature (300 K), an electron mobility of 5620 $cm^2/V \cdot s$ at room temperature (300 K), a two-dimensional electron gas concentration of $2.16E12/cm^2$ at 77 K, and an electron mobility of 13900 $cm^2/V \cdot s$ at 77 K. In addition, as a result of performing a CV measurement by using an Al schottky electrode with respect to this structure, a pinch-off voltage at a residual carrier concentration of $1E15$ $cm^3$ was −2.19 V.

As has been described above, the present invention is to provide a considerable amount of benefit even when the present invention is applied to HEMTs, in that possibilities are open for using a pseudomorphic HEMT formed on a GaAs substrate comprising InGaP electron supplying layers and InGaP spacer layers being favorable at a time of fabricating electronic devices for the purpose of obtaining various high-speed devices driven within an ultra high frequency band above several tens of GHz controlled by an electron velocity being closely correlating with an electron mobility.

INDUSTRIAL APPLICABILITY

According to the present invention, there is provided a pseudomorphic (pseudomorphic high electron mobility field effect transistor) structure epitaxial that has favorable characteristics which have never been reported before and is advantageous to the fabrication of electronic devices, as described above.

The invention claimed is:

1. A compound semiconductor epitaxial substrate for use in a pseudomorphic high electron mobility field effect transistor, comprising
    an InGaAs layer as a channel layer,
    an InGaP layer containing n-type impurities as a front side electron supplying layer, and
    an InGaP layer as a front side spacer layer between said channel layer and said front side electron supplying layer,
    said InGaAs layer having an electron mobility at room temperature (300 K) of 8000 $cm^2/V \cdot s$ or more.

2. The compound semiconductor epitaxial substrate according to claim 1, further comprising an InGaP layer containing n-type impurities also as a back side electron supplying layer and comprising an InGaP layer as a back side spacer layer between said channel layer and said back side electron supplying layer.

3. The compound semiconductor epitaxial substrate according to claim 1, or 2, wherein an In composition of the InGaAs layer constituting of said channel layer is 0.25 or more.

4. A method for manufacturing the compound semiconductor epitaxial substrate according to claim 3, characterized in that an epitaxial layer of each compound semiconductor is formed by employing an MOCVD method.

5. The compound semiconductor epitaxial substrate according to claim 1, or 2, wherein GaAs layers each of which has a thickness of 4 nm or more are laminated on said channel layer in contact with a top surface and a bottom surface of said channel layer, respectively.

6. A method for manufacturing the compound semiconductor epitaxial substrate according to claim 5, characterized in that an epitaxial layer of each compound semiconductor is formed by employing an MOCVD method.

7. A method for manufacturing the compound semiconductor epitaxial substrate according to claim 1, or 2, characterized in that an epitaxial layer of each compound semiconductor is formed by employing an MOCVD method.

8. A compound semiconductor epitaxial substrate for use in a pseudomorphic high electron mobility field effect transistor, comprising
    an InGaAs layer as a channel layer, and
    an InGaP layer containing n-type impurities as a front side electron supplying layer,
    said InGaAs layer having an electron mobility at room temperature (300 K) of 8000 $cm^2/V \cdot s$ or more and having an In composition of 0.25 or more.

* * * * *